United States Patent
Chung et al.

(10) Patent No.: US 9,351,377 B2
(45) Date of Patent: May 24, 2016

(54) DIMMING CONTROL DEVICE AND METHOD

(71) Applicant: Sang Min Chung, Seoul (KR)

(72) Inventors: Sang Min Chung, Seoul (KR); Gyu Ho Lee, Gyeonggi-do (KR)

(73) Assignee: Sang Min Chung (KR)

( * ) Notice: Subject to any disclaimer, the term of this patent is extended or adjusted under 35 U.S.C. 154(b) by 0 days.

(21) Appl. No.: 14/650,340

(22) PCT Filed: Dec. 14, 2012

(86) PCT No.: PCT/KR2012/010930
§ 371 (c)(1),
(2) Date: Jun. 8, 2015

(87) PCT Pub. No.: WO2014/092221
PCT Pub. Date: Jun. 19, 2014

(65) Prior Publication Data
US 2015/0312991 A1    Oct. 29, 2015

(51) Int. Cl.
*H05B 37/02* (2006.01)
*H03K 17/96* (2006.01)

(52) U.S. Cl.
CPC ........ *H05B 37/0227* (2013.01); *H05B 37/0209* (2013.01); *H03K 17/962* (2013.01)

(58) Field of Classification Search
CPC ..................................................... H05B 37/02
USPC ................. 315/291, 294, 297, 307, 312, 360
See application file for complete search history.

(56) References Cited

U.S. PATENT DOCUMENTS

| | | | | |
|---|---|---|---|---|
| 2006/0055679 | A1* | 3/2006 | Grinshpoon | H05B 39/086 345/173 |
| 2007/0103433 | A1* | 5/2007 | Katz | G08B 25/008 345/156 |
| 2007/0290628 | A1* | 12/2007 | Altonen | G06F 3/03547 315/291 |
| 2011/0284726 | A1 | 11/2011 | Leinen | |
| 2013/0030589 | A1* | 1/2013 | Pessina | H05B 37/0272 700/295 |
| 2013/0141018 | A1* | 6/2013 | Kamii | H05B 33/0863 315/360 |

FOREIGN PATENT DOCUMENTS

| | | |
|---|---|---|
| CN | 201754640 | 3/2011 |
| CN | 102316631 | 1/2012 |
| CN | 202269061 | 6/2012 |
| JP | 3164349 | 11/2010 |
| KR | 100908733 | 7/2009 |
| KR | 1020110107938 | 10/2011 |
| KR | 1020120057490 | 6/2012 |
| KR | 1020120076931 | 7/2012 |
| TW | 201021618 | 6/2010 |
| TW | M408218 | 7/2011 |
| TW | M417741 | 12/2011 |

OTHER PUBLICATIONS

International Search Report, International Application No. PCT/KR2012/010930, dated Sep. 25, 2013.

* cited by examiner

*Primary Examiner* — Tung X Le
(74) *Attorney, Agent, or Firm* — Perman & Green, LLP

(57) ABSTRACT

The present invention relates to a dimming control device and method, and a dimming control device according to an embodiment of the present invention may control the ON/OFF of a lamp depending on whether a power pad is touched, and control the brightness of the lamp depending on whether dimming pads are touched. Thus, a user may control brightness step by step and may conveniently manipulate each step of brightness.

10 Claims, 3 Drawing Sheets

DIMMING CONTROL DEVICE AND METHOD

CROSS REFERENCE TO RELATED APPLICATIONS

This application is the National Stage of International Application No. PCT/KR2012/010930, having an International Filing Date of 14 Dec. 2012, which designated the United States of America, and which International Application was published under PCT Article 21 (s) as WO Publication 2014/092221 A1, the disclosure of which is incorporated herein by reference in its entirety.

BACKGROUND

The presently disclosed embodiment relates to a dimming control apparatus and a dimming control method thereof.

Recently, in a lighting, a dimming function, that is, a photochromic function, to control an amount of light of a lamp has been used for various lamps including an incandescent lamp, a fluorescent lamp, and a light-emitting diode (LED).

In addition, various control methods thereof have been provided. In particular, many dimming stabilizers have been supplied since a dimming function for power saving has begun to be used for a fluorescent lamp which is one of lamps that are used the most in the country.

However, since most diming stabilizers are operated through a manual method using a controller, it is inconvenient and cumbersome for a user to operate it and an effective control due to changes in an amount of natural lighting or ambient light is not possible. Additionally, since a dimming function is controlled using illuminance of a lamp that is uniformly set, there is a problem in that a user cannot control brightness by stages and cannot conveniently manipulate levels of brightness.

SUMMARY

The presently disclosed embodiment provides a dimming control apparatus in which a user may control brightness by stages and may conveniently manipulate levels of brightness, and a dimming control method thereof.

According to an aspect of the presently disclosed embodiment, there is provided a dimming control apparatus that controls illuminance of a lamp, the dimming control apparatus including a power pad that is configured as a touch panel for turning on/off power supply of the lamp; dimming pads that are configured as at least two touch panels for controlling illuminance of the lamp; a sensing unit that senses touch operations from the power pad and the dimming pads; and a control unit that controls turning on/off of power supply to the lamp according to whether or not the power pad is touched and controls illuminance of the lamp according to whether or not the dimming pads are touched.

The control unit controls the illuminance of the lamp using a dimming value according to touch locations of the dimming pads configured as at least two touch panels.

The control unit controls the illuminance of the lamp according to touch directions of the dimming pads configured as at least two touch panels.

The dimming pads configured as at least two touch panels are arranged by stages to correspond to the illuminance of the lamp.

The dimming control apparatus further includes at least two display lamps that are turned on/off according to whether the dimming pads configured as at least two touch panels are touched and display operational states of the respective dimming pads.

The dimming control apparatus further includes a storage unit that stores a dimming value at the time when the lamp is turned on/off, wherein the control unit controls the illuminance of the lamp to correspond to the stored dimming value when the lamp is turned on.

According to another aspect of the presently disclosed embodiment, there is provided a dimming control method of controlling illuminance of a lamp, the dimming control method including turning on/off power supply to the lamp when a power pad that is configured as a touch panel for turning on/off the power supply to the lamp; and controlling the illuminance of the lamp according to whether dimming pads configured as at least two touch panels for controlling the illuminance of the lamp are touched.

In the controlling of the illuminance of the lamp, the illuminance of the lamp is controlled using a dimming value according to touch locations of the dimming pads configured as at least two touch panels.

In the controlling of the illuminance of the lamp, the illuminance of the lamp is controlled according to touch directions of the dimming pads configured as at least two touch panels.

The dimming control method further includes storing the dimming value of the lamp when the power pad is touched; and turning off power supply to the lamp.

In a dimming control apparatus according to one or more aspects of the presently disclosed embodiment, power on/off of a lamp is controlled according to whether or not a power pad is touched and illuminance of the lamp is controlled according to whether or not dimming pads are touched so that a user may control brightness step by step and may conveniently manipulate levels of brightness.

DETAILED DESCRIPTION

Figure 1:
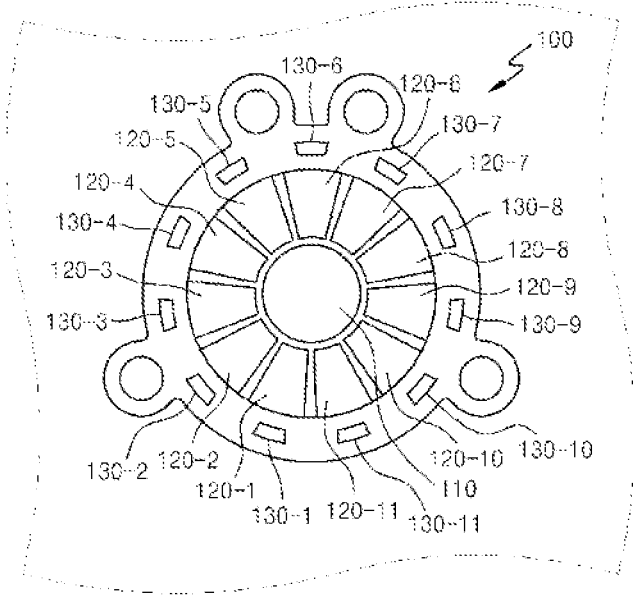
FIG. 1 is a diagram showing the appearance of a dimming control apparatus, according to an aspect of the presently disclosed embodiment.

Various changes in form and details may be made to the presently disclosed embodiment and thus should not be construed as being limited to the aspects set forth herein. The presently disclosed embodiment is not limited to the aspects described in the present description, and thus it should be understood that the presently disclosed embodiment does not include every kind of variation example or alternative equivalent included in the spirit and scope of the presently disclosed embodiment. Also, while describing the aspects, detailed descriptions about related well-known functions or configurations that may diminish the clarity of the points of the aspects of the presently disclosed embodiment will be omitted.

Also, though terms like a first and a second are used to describe various elements, components, regions, layers, and/ or portions in various aspects of the presently disclosed embodiment, the elements, components, regions, layers, and/or portions should not be limited by these terms. These terms are only used to distinguish one element, component, region, layer, or portion from another.

The terminology used herein is for the purpose of describing particular aspects only and is not intended to be limiting of exemplary aspects. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

Hereinafter, the presently disclosed embodiment will be described in detail by explaining exemplary aspects of the disclosed embodiment with reference to the attached drawings. Like reference numerals in the drawings denote like elements, and thus their description will be omitted.

FIG. 1 is a diagram showing the appearance of a dimming control apparatus, according to an aspect of the presently disclosed embodiment.

Referring to FIG. 1, the dimming control apparatus 100 is an apparatus that controls illuminance of a lamp (not shown). The dimming control apparatus 100 according to an aspect of the presently disclosed embodiment may be used for various types of lightings, for example, a desk lamp or a general lighting, and the lamp may be any of various types of lamps, for example, a light-emitting diode (LED) or a fluorescent lamp.

The dimming control apparatus 100 may include a power pad 110, dimming pads 120-1 to 120-11, and display lamps 130-1 to 130-11 that display operational states of the respective dimming pads 120-1 to 120-11. The power pad 110 is disposed in a center portion of a user interface unit of the dimming control apparatus 100 and is configured as a touch panel. Here, the touch panel may be an optical sensor-type, resistive-type, capacitive overlay-type, or hybrid-type touch panel, and the presently disclosed embodiment is not limited thereto. The display lamps 130-1 to 130-11 may be turned on/off according to whether or not the power pad 110 is touched.

In FIG. 1, the dimming pads 120-1 to 120-11 form a circle centering around the power pad 10. The dimming pads 120-1 to 120-11 show the degree of illuminance of the respective display lamps 130-1 to 130-11, and the dimming pads 120-1 to 120-11 are configured as touch panels similar to the power pad 110. The dimming pads 120-1 to 120-11 are disposed in a direction in which illuminance of the display lamps 130-1 to 130-11 increases by stages. For example, the dimming pad 120-1 may show a minimum diming value, and the dimming pad 120-11 may show a maximum dimming value. Thus, when a user touches the dimming pad 120-1, the luminance of the lamp is controlled using minimum brightness of the lamp, and when a user touches the dimming pad 120-11, the luminance of the lamp is controlled using maximum brightness of the lamp. In an aspect of the presently disclosed embodiment, dimming control is performed using a predetermined dimming value according to arrangement of the dimming pads 120-1 to 120-11. In another aspect of the presently disclosed embodiment, when a user drags the dimming pads 120-1 to 120-11 in a dragging direction or a touch direction, for example, clockwise, the user may perform dimming control for increasing illuminance of the lamp by a length between the dimming pad that is initially touched by the user and the dimming pad that is finally touched by the user. On the other hand, when the user drags counterclockwise, the user may perform dimming control for decreasing illuminance of the lamp. Here, although eleven dimming pads are shown in FIG. 1, the presently disclosed embodiment is not limited thereto. In addition, although FIG. 1 shows the power pad 110 and the dimming pads 120-1 to 120-11 that are separated from each other, the presently disclosed embodiment is not limited thereto, and the power pad 110 and the dimming pads 120-1 to 120-11 may be configured in an integrated fashion.

Referring back to FIG. 1, the display lamps 130-1 to 130-11 are shown that display the operational states of the respective dimming pads 120-1 to 120-11 and are disposed adjacent to the respective dimming pads 120-1 to 120-11. The display lamps 130-1 to 130-11 are turned on or turned off according to whether or not the dimming pads 120-1 to 120-11 are touched.

Figure 2:
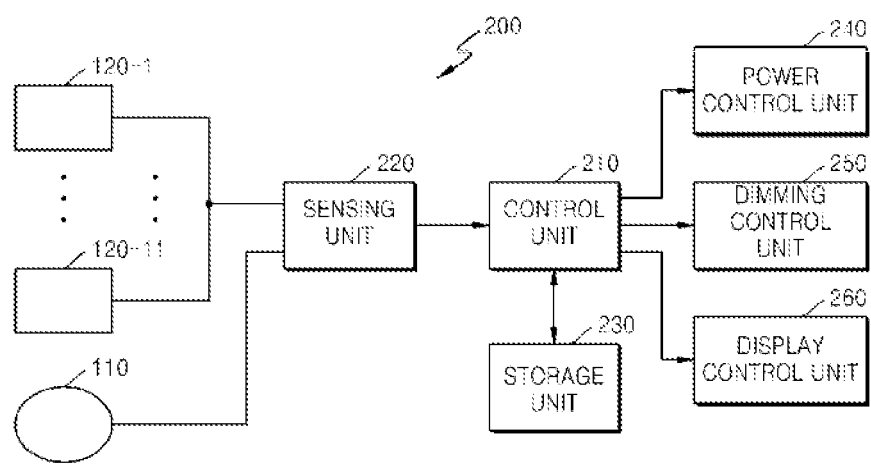
FIG. 2 is a block diagram schematically showing the dimming control apparatus shown in FIG. 1.

FIG. 2 is a block diagram schematically showing the dimming control apparatus 100 shown in FIG. 1.

Referring to FIG. 2, the dimming control apparatus 200 includes the dimming pads 120-1 to 120-11, a sensing unit 220 that senses a touch operation to the power pad 110, a control unit 210 that performs turning on/off of the lamp and dimming control according to a touch signal corresponding to the touch operation to the power pad 110 which is sensed by the sensing unit 220, and a storage unit 230.

The sensing unit 220 senses touch operations to the power pad 110 and the dimming pads 120-1 to 120-11. Here, in order to prevent malfunction of the power pad 110, a sensing period of the sensing unit 220 may be set to be longer than sensing periods of the dimming pads 120-1 to 120-11 so as to sense the touch operation.

The control unit 210 controls power on/off of the lamp according to whether or not the power pad 110 is touched, and controls illuminance of the lamp according to whether or not the dimming pads 120-1 to 120-11 are touched. In addition, the control unit 210 controls turning on/off of the display lamps 130-1 to 130-11 shown in FIG. 1. Specifically, the control unit 210 may be a micro computer unit (MCU). The control unit 210 may control power on/off and dimming control of the lamp and controls turning on/off of the display lamps 130-1 to 130-11 using a power control unit 240, a dimming control unit 250, and a display control unit 260.

The storage unit 230 stores a dimming value and a dimming control value that are currently set when the lamp is turned off due to the power pad 110 that has been touched. The control unit 210 may perform dimming control using the stored dimming value when the lamp is turned on due to the power pad 110 that has been touched. In addition, the control unit 210 may perform dimming control on the basis of an intermediate dimming value when there is no set or stored dimming value.

Figure 3:
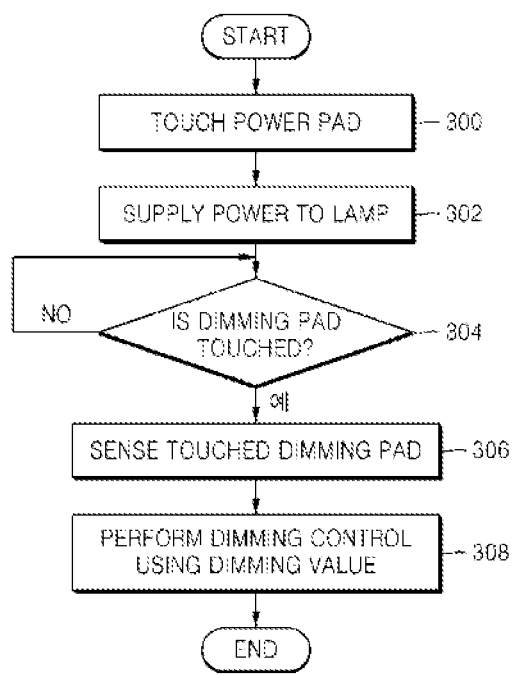
FIG. 3 is a flowchart for describing a dimming control method, according to another aspect of the presently disclosed embodiment.

FIG. 3 is a flowchart for describing a dimming control method, according to another aspect of the presently disclosed embodiment.

Referring to FIG. 3, when a power pad is touched in operations 300 and 302, power is supplied to a lamp to turn on the lamp. When a dimming pad is touched in operation 304, it is sensed, for example, which one of the eleven dimming pads shown in FIG. 1 has been touched in operation 306. Dimming control is performed using a dimming value corresponding to the touched dimming pad in operation 308. Although not shown in FIG. 3, controlling turning on of the display lamp of the touched dimming pad shown in FIG. 1 may be performed at the same time when the dimming control is performed.

Figure 4:
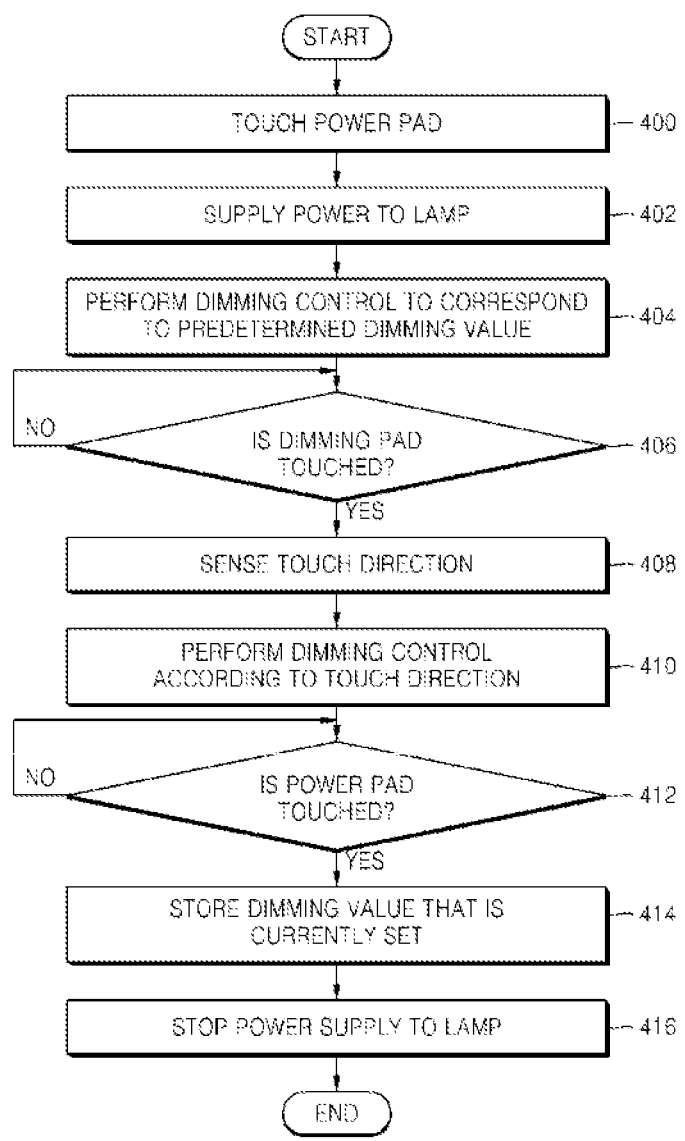
FIG. 4 is a flowchart for describing a dimming control method, according to another aspect of the presently disclosed embodiment.

FIG. 4 is a flowchart for describing a dimming control method, according to another aspect of the presently disclosed embodiment.

Referring to FIG. 4, when a power pad is touched in operations 400 and 402, power is supplied to a lamp to turn on the lamp. Dimming control is performed to correspond to a predetermined dimming value in operation 404. Here, the predetermined dimming value may be an intermediate dimming value that is set by default or a dimming value that is set before the previous power off.

It is determined whether or not a dimming pad has been touched in operation 406. A touch direction or a drag direction of the dimming pad are sensed in operations 408 and 410, and dimming control is performed according to the sensed direction. For example, when five dimming pads are dragged clockwise, the dimming control may be performed on the lamp using illuminance level 5, while when three dimming pads are dragged counterclockwise, the dimming control may be performed using a dimming value that is reduced by three levels from the current dimming value.

When the power pad is touched in operation 412, a dimming value that is currently set is stored in operation 414, and then power supply to the lamp is stopped to turn off the lamp in operation 416.

The device described herein may comprise a processor, a memory for storing program data and executing it, a permanent storage such as a disk drive, a communications port for handling communications with external devices, and user interface devices, such as a touch panel, keys, buttons, etc. When software modules or algorithms are involved, these software modules may be stored as program instructions or computer readable codes executable by the processor on a computer-readable medium. Examples of the computer readable recording medium are magnetic storage media (e.g., ROM, floppy disks, and hard disks), and optical recording media (e.g., CD-ROMs and DVDs). The computer readable recording medium can also be distributed over network coupled computer systems so that the computer readable code is stored and executed in a distributed fashion. These media can be read by a computer, stored in the memory, and executed by the processor.

All references, including publications, patent applications, and patents, cited herein are hereby incorporated by reference to the same extent as if each reference were individually and specifically indicated to be incorporated by reference and were set forth in its entirety herein.

For the purposes of promoting an understanding of the principles of the disclosed embodiment, reference has been made to the preferred aspects illustrated in the drawings, and specific terminology has been used to describe these aspects. However, no limitation of the scope of the disclosed embodiment is intended by this specific terminology, and the disclosed embodiment should be construed to encompass all aspects that would normally occur to one of ordinary skill in the art.

The presently disclosed embodiment may be described in terms of functional block components and various processing steps. Such functional blocks may be realized by any number of hardware and/or software components configured to perform the specified functions. For example, the presently disclosed embodiment may employ various integrated circuit components, e.g., memory elements, processing elements, logic elements, look-up tables, and the like, which may carry out a variety of functions under the control of one or more microprocessors or other control devices. Similarly, where the elements of the presently disclosed embodiment are implemented using software programming or software elements the disclosed embodiment may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, the presently disclosed embodiment could employ any number of conventional techniques for electronics configuration, signal processing and/or control, data processing and the like. The words "mechanism", "element", "means", and "configuration" are used broadly and are not limited to mechanical or physical embodiments, but can include software routines in conjunction with processors, etc.

The particular implementations shown and described herein are illustrative examples of the disclosed embodiment and are not intended to otherwise limit the scope of the disclosed embodiment in any way. For the sake of brevity, conventional electronics, control systems, software development and other functional aspects of the systems may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the disclosed embodiment unless the element is specifically described as "essential" or "critical".

The use of the terms "a" and "an" and "the" and similar referents in the context of describing the disclosed embodiment (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The presently disclosed embodiment is not limited to the described order of the steps. The use of any and all examples, or exemplary language (e.g., "such as") provided herein, is intended merely to better illuminate the disclosed embodiment and does not pose a limitation on the scope of the disclosed embodiment unless otherwise claimed. Numerous modifications and adaptations will be readily apparent to those skilled in this art without departing from the spirit and scope of the presently disclosed embodiment.

While the presently disclosed embodiment has been particularly shown and described with reference to exemplary aspects thereof, it will be understood by those of ordinary skill in the art that various changes in form and details may be made therein without departing from the spirit and scope of the presently disclosed embodiment as defined by the following claims.

What is claimed is:

1. A dimming control apparatus that controls illuminance of a lamp, the dimming control apparatus comprising:
   a power pad, formed in a center of the dimming control apparatus and configured as a first touch panel for turning on/off power supply of the lamp;

dimming pads, formed in a circle surrounding a periphery of the power pad and configured as at least two second touch panels for controlling illuminance of the lamp;

a sensing unit that senses touch operations from the power pad and the dimming pads; and a control unit interfaced with the sensing unit, the control unit controls turning on/off of power supply to the lamp according to whether or not the sensing unit senses touching of the power pad and controls illuminance of the lamp according to whether or not the sensing unit senses touching of the dimming pads.

2. The dimming control apparatus of claim 1, wherein the control unit controls the illuminance of the lamp using a dimming value according to touch locations of the dimming pads configured as at least two second touch panels.

3. The dimming control apparatus of claim 2, wherein the control unit controls the illuminance of the lamp according to touch directions of the dimming pads configured as at least two second touch panels.

4. The dimming control apparatus of claim 1, wherein the dimming pads configured as at least two second touch panels are arranged by stages to correspond to the illuminance of the lamp.

5. The dimming control apparatus of claim 4, further comprising at least two display lamps that are turned on/off according to whether the dimming pads configured as at least two second touch panels are touched and display operational states of the respective dimming pads.

6. The dimming control apparatus of claim 1, further comprising a storage unit that stores a dimming value at the time when the lamp is turned on/off, wherein the control unit controls the illuminance of the lamp to correspond to the stored dimming value when the lamp is turned on.

7. A dimming control method of controlling illuminance of a lamp, the dimming control method comprising:

turning on/off power supply to the lamp with a controller when a sensor interfaced with the controller senses touching of a power pad formed in a center of a dimming control apparatus and configured as a first touch panel for turning on/off the power supply to the lamp; and controlling the illuminance of the lamp with the controller according to whether the sensor senses touching of dimming pads, formed in a circle surrounding a periphery of the power pad and configured as at least two second touch panels, effecting controlling the illuminance of the lamp.

8. The dimming control method of claim 7,
wherein in the controlling of the illuminance of the lamp, the illuminance of the lamp is controlled using a dimming value according to touch locations of the dimming pads configured as at least two second touch panels.

9. The dimming control method of claim 7,
wherein in the controlling of the illuminance of the lamp, the illuminance of the lamp is controlled according to touch directions of the dimming pads configured as at least two second touch panels.

10. The dimming control method of claim 7, further comprising:

storing the dimming value of the lamp when the power pad is touched; and turning off power supply to the lamp.

* * * * *